(12) United States Patent
Bakarian et al.

(10) Patent No.: US 6,810,510 B2
(45) Date of Patent: Oct. 26, 2004

(54) METHOD FOR ELIMINATING FALSE FAILURES SAVED BY REDUNDANT PATHS DURING CIRCUIT AREA ANALYSIS ON AN INTEGRATED CIRCUIT LAYOUT

(75) Inventors: Sergei Bakarian, Sunnyvale, CA (US); Julie Segal, Palo Alto, CA (US)

(73) Assignee: Heuristics Physics Laboratories, Inc., San Jose, CA (US)

( * ) Notice: Subject to any disclaimer, the term of this patent is extended or adjusted under 35 U.S.C. 154(b) by 323 days.

(21) Appl. No.: 10/167,113

(22) Filed: Jun. 11, 2002

(65) Prior Publication Data

US 2003/0229865 A1 Dec. 11, 2003

(51) Int. Cl.$^7$ .................. G06F 17/50; G06F 19/00; G01R 31/02; G01R 31/26; G01R 31/28
(52) U.S. Cl. ................... 716/5; 700/110; 702/59; 703/14
(58) Field of Search ............... 716/5; 703/14; 700/110; 702/59

(56) References Cited

U.S. PATENT DOCUMENTS

| | | | | |
|---|---|---|---|---|
| 5,452,223 A | * | 9/1995 | Zuercher et al. | 702/58 |
| 5,831,437 A | * | 11/1998 | Ramadoss et al. | 324/537 |
| 6,247,853 B1 | * | 6/2001 | Papadopoulou et al. | 716/4 |
| 6,317,859 B1 | * | 11/2001 | Papadopoulou | 716/4 |
| 6,334,100 B1 | * | 12/2001 | Ahrikencheikh et al. | 703/14 |
| 6,461,882 B2 | * | 10/2002 | Ishida et al. | 438/17 |
| 6,542,830 B1 | * | 4/2003 | Mizuno et al. | 702/35 |
| 6,618,856 B2 | * | 9/2003 | Coburn et al. | 717/135 |
| 2002/0053066 A1 | * | 5/2002 | Richter et al. | 716/5 |

OTHER PUBLICATIONS

Gharaybeh et al., "False–path removal using delay fault simulation", 1998 Proceeding of Seventh Asian Test Symposium, Dec. 2, 1998, pp. 82–87.*

Fengling et al., "Distinguish real or false fault of single line–to–ground short–circhit for radial distribution network", 1998 Proceedings of International Conference on Power System Technology, vol. 1, Aug. 18, 1998, pp. 260–264.*

W. Grobman et al., Reticle Enhancement Technology: Implications and Challenges for Physical Design, DAC, 6 pages, Jun. 2001.

D. Woodie, "Chemical Mechanical Polishing Primer", [Internet], http://www.nnf.cornell.edu/equipment/CMPPrimer.html, 14 pages printed May 18, 2002 (no date).

L–Edit Quick Reference ENGS85, [Internet] http://engineering.dartmouth.edu/~microeng/ledit/ledit.hints.html, 2 pages, Apr. 21, 2001, printed Mar. 22, 2002..

C. G. Levey, "Low Resolution Mask Making Procedure [SIC]", [Internet] http://thayer.dartmouth.edu/~microeng/ledit/leditlrmask.html, 2 pages, printed Jun. 19, 2003.

* cited by examiner

Primary Examiner—Leigh M. Garbowski
Assistant Examiner—Phallaka Kik
(74) Attorney, Agent, or Firm—Sierra Patent Group, Ltd.

(57) ABSTRACT

A method for eliminating false failures saved by redundant paths during critical area analysis of an integrated circuit layout is described. Monte Carlo simulation generates simulated defects for an integrated circuit layout. Vertices significantly encroached by the simulated defects are identified. Information of predefined sets of vertices associated with individual nets including at least one of the identified vertices is retrieved. Failures resulting from the simulated defects are indicated only if all elements of at least one of the predefined sets of vertices are one of the identified vertices. The predefined sets of vertices are determined prior to circuit area analysis by extracting nets from an integrated circuit layout, and determining the predefined sets of vertices for individual nets such that the net fails only if all elements of individual of the predefined sets of vertices are significantly encroached by simulated defects.

20 Claims, 6 Drawing Sheets

METHOD FOR ELIMINATING FALSE FAILURES SAVED BY REDUNDANT PATHS DURING CIRCUIT AREA ANALYSIS ON AN INTEGRATED CIRCUIT LAYOUT

FIELD OF THE INVENTION

The present invention generally relates to circuit area analysis on integrated circuit layouts and in particular, to a method for eliminating false failures saved by redundant paths during circuit area analysis on an integrated circuit layout.

BACKGROUND OF THE INVENTION

Circuit area analysis predicts failures of an integrated circuit that result from probabilistic defects. One common problem with conventional circuit area analysis techniques is their general inability to eliminate false failures saved by redundant paths during the circuit area analysis. This deficiency may result in overly conservative design and unnecessary testing for false failures, both of which add unwarranted cost to the manufacture of the integrated circuit.

OBJECTS AND SUMMARY OF THE INVENTION

Accordingly, an object of the present invention is a method for eliminating false failures saved by redundant paths during circuit area analysis on an integrated circuit layout.

This and additional objects are accomplished by the various aspects of the present invention, wherein briefly stated, one aspect is a method for eliminating false failures saved by redundant paths during critical area analysis of an integrated circuit layout, comprising: identifying vertices significantly encroached by one or more simulated defects; and eliminating false failures resulting from the one or more simulated defects if all nets including at least one of the identified vertices have at least one redundant path that does not include any of the identified vertices.

Another aspect is a method for eliminating false failures saved by redundant paths during critical area analysis of an integrated circuit layout, comprising: identifying vertices significantly encroached by one or more simulated defects; retrieving predefined sets of vertices associated with individual of nets including at least one of the identified vertices; and indicating a failure resulting from the one or more simulated defects for each instance where all elements of at least one of the predefined sets of vertices are one of the identified vertices.

Additional objects, features and advantages of the various aspects of the invention will become apparent from the following description of its preferred embodiments, which description should be taken in conjunction with the accompanying drawings.

DETAILED DESCRIPTION OF THE PREFERRED EMBODIMENT

Figure 1:
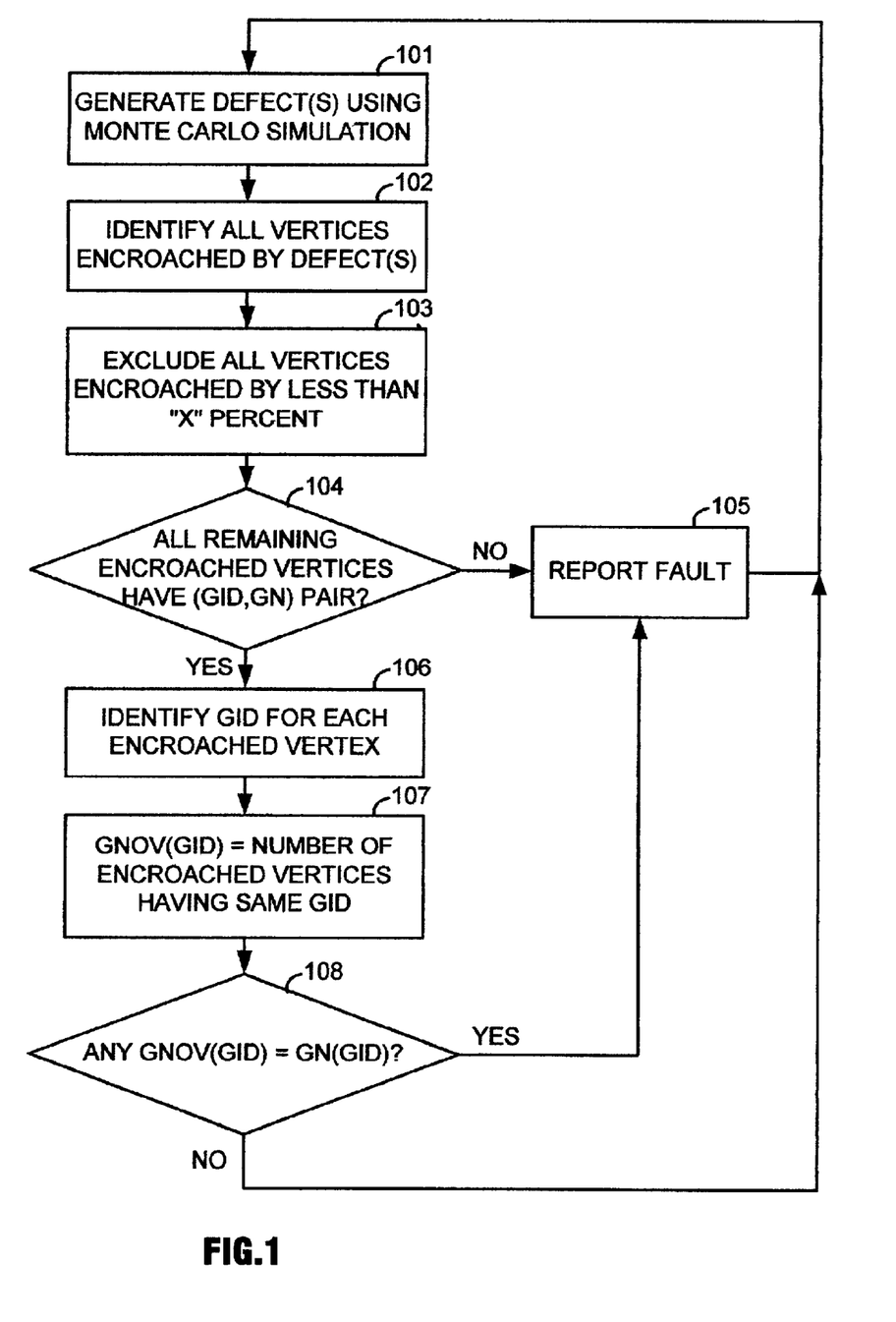
FIG. 1 illustrates, as an example, a flow diagram of a method for performing circuit area analysis including a method for eliminating false failures saved by redundant paths during the circuit area analysis, utilizing aspects of the present invention.

FIG. 1 illustrates a flow diagram of a method for performing circuit area analysis on an integrated circuit layout. Included is a method for eliminating false failures saved by redundant paths during the circuit area analysis. A computer programmed to perform the method along with a memory for storing certain information is its preferred implementation.

In 101, Monte Carlo simulation generates in a conventional fashion, one or more simulated defects individually having probabilistic size and probabilistic location on a layer of the integrated circuit layout. The defects may be generated one at a time for circuit area analysis, or multiples at a time based upon understood or assumed probabilities. In 102, all vertices encroached by the one or more simulated defects are identified. The vertices in this case can be conventional vias that couple conductive layers, conventional contacts that couple integrated circuit regions to conductive layers, or a mix of such conventional vias and contacts. As understood herein and the following claims, a vertex is considered "significantly encroached" by a simulated defect when its corresponding actual defect, injected during the manufacturing process, affects the electrical characteristics of the vertex. Such actual defects may occur, for example, during a photolithography process resulting in one or more imperfectly formed vertices.

Figure 8:
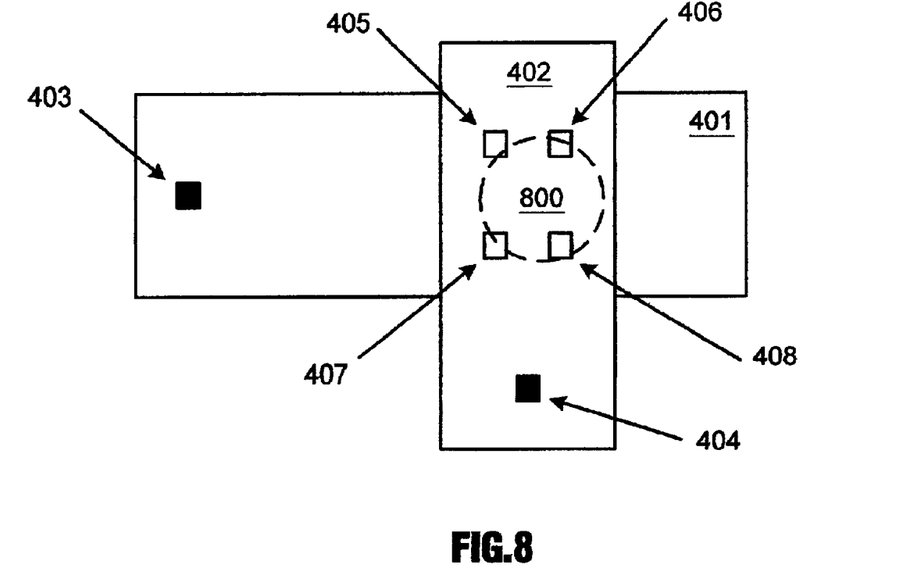
FIGS. 8~9 respectively illustrate, as examples, a top plan view of the first net with one large simulated defect encroaching some of its vertices and with several smaller simulated defects encroaching some of its vertices.
Figure 9:
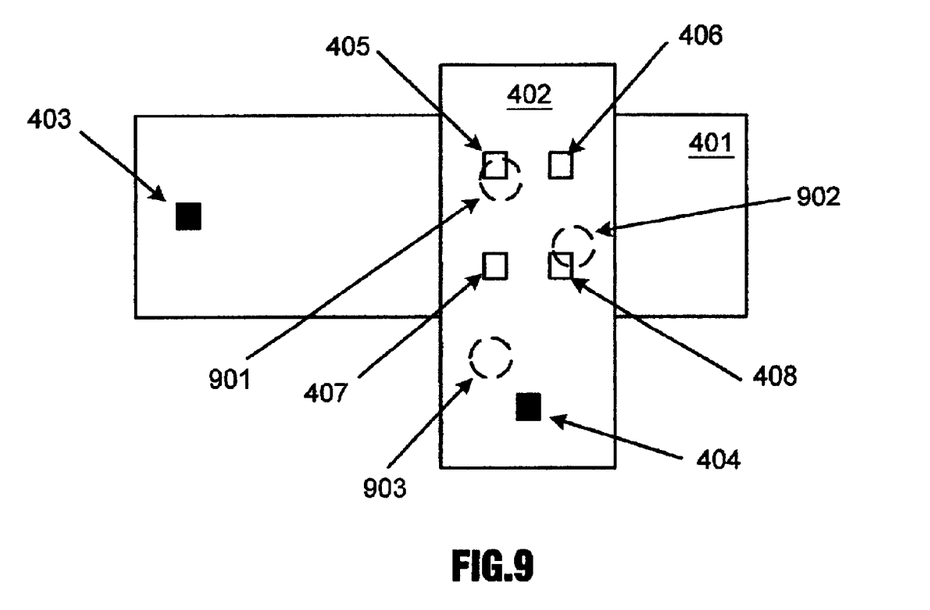

In 103, vertices that are encroached by less than a given percentage are excluded. The remaining vertices are referred to as being significantly encroached. When a vertex is significantly encroached by a simulated defect, the vertex becomes effectively an electrical open, because of its increased resistance, causing an effective conductivity break in its path. As an example, FIG. 8 illustrates a top plan view of a net with one large simulated defect 800 encroaching the four vias 405, 406, 407 and 408. If the given percentage is, for example, 50%, then vias 406 and 408 are significantly encroached and vias 405 and 407 are excluded from processing. The simulated defect in this case is shown as a dotted circle, because it is found between the first and second metal layers 401 and 402. FIG. 9, on the other hand, illustrates a top plan view of the same net with three smaller simulated defects 901~903. In this case, simulated defect 901 encroaches via 405, simulated defect 902 encroaches via 408, and simulated defect 903 does not encroach on any vias. The number of such simulated defects may be determined by a defect density function of the manufacturing process.

In 104, it is determined whether all remaining encroached vertices have at least one group identification ("GID") and group count ("GN") pair associated with it. If an encroached vertex does not have such a pair, then it is assumed to be a critical vertex and in 105, a fault resulting from the simulated defect is reported. A critical vertex is a vertex that has no redundant vertices, so that if a simulated defect significantly encroaches it, its associated net fails. As will become apparent, a critical vertex can also be considered a predefined set of one with its only element being the critical vertex. In this case, if it is assigned a group identification, and a group count of one, then 104 is omitted.

In 106, group identifications for each encroached vertex are identified. A vertex may have more than one group identification associated with it. This situation occurs when the vertex is included in more than one predefined set of vertices (or group), each having its own unique group identification. Each set of predefined vertices also has a group count associated with it that indicates the number of elements in the predefined set of vertices. As will be described subsequently, each predefined set of vertices is associated with a net and generated such that if all elements of the predefined set of vertices are significantly encroached by one or more defects, then the net fails due to conductivity breaks at the significantly encroached vertices.

In 107, for each group identification identified in 106, the number of encroached vertices having that GID is counted. In 108, a determination is made whether there is any instance of the number of encroached vertices having a same GID ("GNOV(GID") being equal to the group count for that same GID ("GN(GID)"). If there is, then in 105, a failure or fault is reported. Otherwise, the method returns to 101 to perform another Monte Carlo simulation to generate one or more simulated defects and repeat 101~108.

As can be readily appreciated, by performing these simple group identification and group count determinations for predefined sets of vertices during the critical area analysis, elimination of false failures saved by redundant paths is quickly and efficiently performed. Consequently, performance of the critical area analysis does not unduly suffer.

Figure 2:
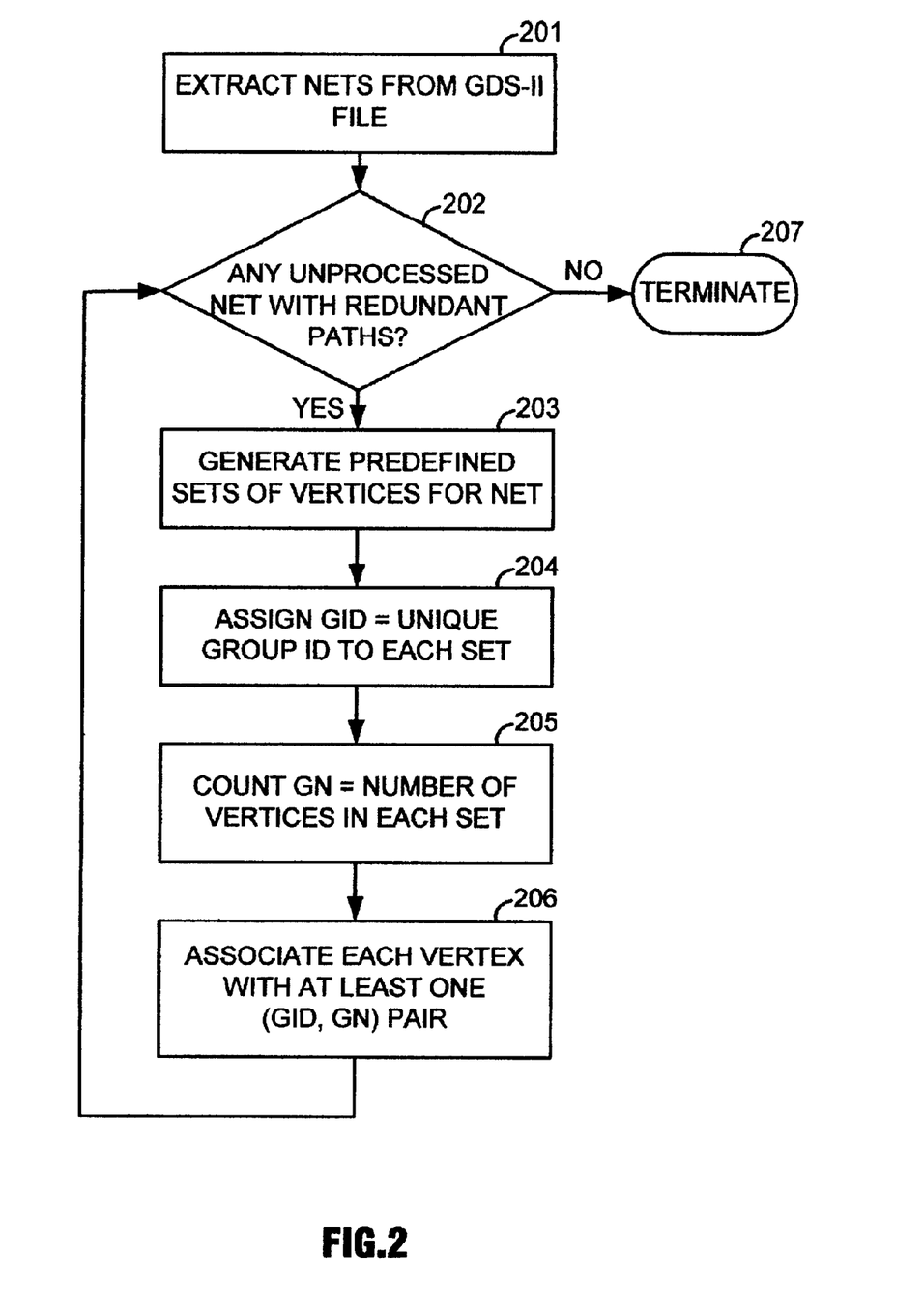
FIGS. 2~3 illustrate, as an example, a method for generating predefined sets of vertices for nets of an integrated circuit layout, utilizing aspects of the present invention.
Figure 3:
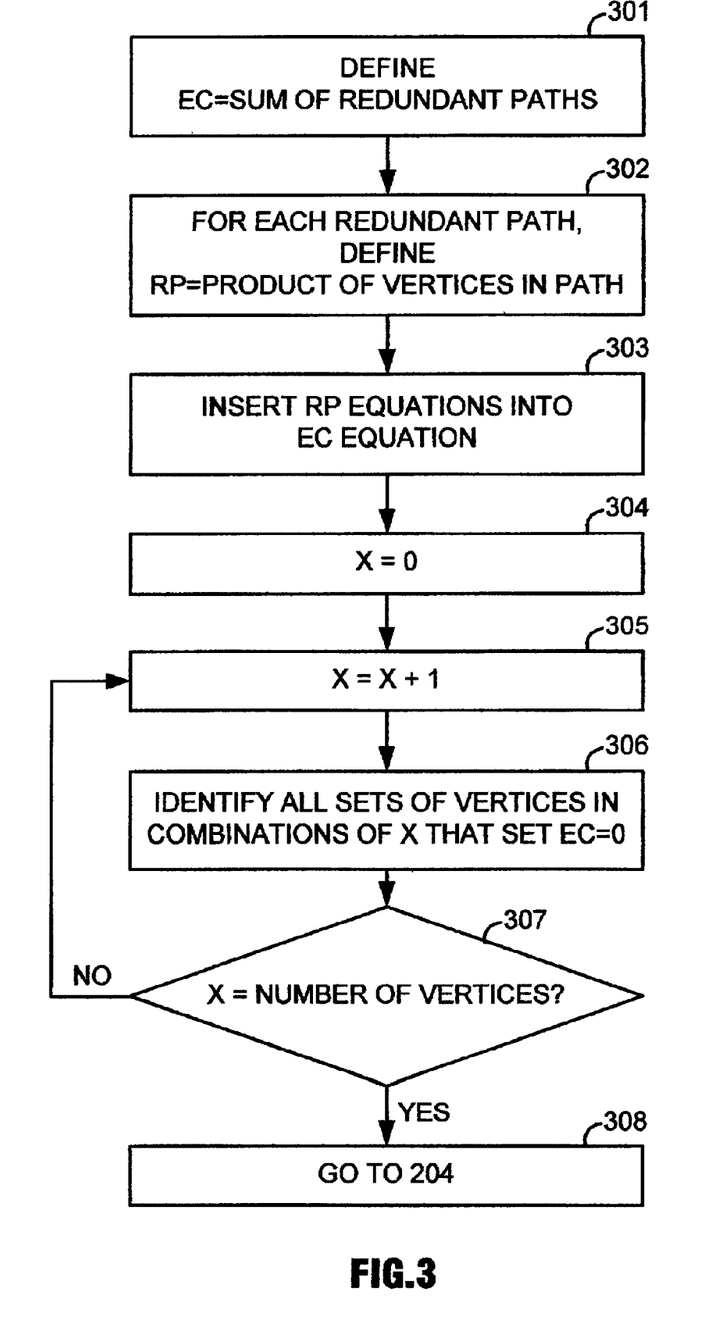

FIGS. 2~3 illustrate, as an example, a method for generating predefined sets of vertices for nets of an integrated circuit layout. Starting with FIG. 2, in 201, nets are extracted in a conventional fashion from a GDS-II file for an integrated circuit layout. In 202, a determination is made whether there are any unprocessed nets having one or more redundant paths. An unprocessed net is one that has not yet been processed through 203~206. A net having one or more redundant paths is one such as the net coupling contact 403 and 404 through redundant paths 501~504 as graphically depicted in FIG. 5, or the net coupling contacts 606 and 607 through redundant paths 701~703 as graphically depicted in FIG. 7. In no such nets are found, then in 207, the processing is terminated.

On the other hand, if an unprocessed net having one or more redundant paths is found, then in 203, predefined sets of vertices are generated for that net. As previously described, these predefined sets of vertices are generated such that if all elements of the predefined set of vertices are significantly encroached by one or more defects, then the net fails due to conductivity breaks at the significantly encroached vertices. One method for performing this function of the method is described in reference to FIG. 3.

In 204, a unique group identification is assigned to each of the predefined sets of vertices. Preferably, this is done after all of the predefined sets of vertices for the net currently being processed have been generated. However, such assignment may also be performed during the generation. In 205, the number of elements (i.e., vertices) in each of the predefined sets of vertices are counted, and the resulting group counts assigned to their respective predefined sets of vertices (i.e., groups).

In 206, each vertex in the predefined sets of vertices is associated with at least one group identification, group count ("GID,GN") pair. As previously described, some of the vertices may be associated with more than one pair if it is an element in more than one of the predefined sets of vertices. The assigned GID, GN pair information is then used as previously described in reference to 104~108 in FIG. 1. Upon completion of 206, the process then jumps back to 202 to find another unprocessed net having redundant paths. When no more of such nets can be found, the process terminates in 207.

FIG. 3 illustrates a flow diagram of a method for determining predefined sets of vertices for a net. The net is assumed to fail if critical or certain combinations of vertices in redundant paths associated with the net are found to be significantly encroached by one or more simulated defects. Consequently, the predetermined sets of vertices are selected from such vertices so that the net is assumed to fail only if all elements of the predefined sets of vertices are significantly encroached by the one or more simulated defects.

A vertex that is significantly encroached by a simulated defect is assumed to represent an electrically open vertex having a logic value of "0". Conversely, a vertex that is not significantly encroached by the simulated defect is assumed to represent an electrically conducting vertex having a logic value of "1". The logic value of a vertex having reference number "xxx" in the figures is denoted herein as $LV_{xxx}$. Logic sums and products then operate on such logic values in a conventional manner, wherein such sums are treated as logical OR and products treated as logical AND functions.

In 301, a net equation "EC" is defined for a net as the logic sum of redundant path equations associated with the net. In 302, each redundant path equation "RP(i)" associated with the net is defined as the logic product of logic values of vertices in the redundant path "i", where i=1, . . . n and "n" is the total number of redundant paths associated with the net. In 303, the redundant path equations are inserted into the net equation so that:

$$EC = \Sigma(RP(i)), \text{ where } i=1, \ldots n \quad (1)$$

When the net equation "EC" becomes equal to zero, the net is said to fail.

In 304, a variable "X" is initialized to zero. In 305, the variable "X" is incremented by one. In 306, the method identifies all sets of vertices in combinations of "X" that set the net equation "EC" to zero when they are each of logic value "0". The identified sets are then added to the predefined sets of vertices, unless they include a previously identified set of vertices for a lesser value of "X". In 307, a determination is made whether or not the variable "X" now equals the total number of different vertices associated with the net in the net equation "EC". If the answer is NO, then the method goes back to 305, incrementing the variable "X" by one and repeating 306 and 307. On the other hand, if the answer is YES, then in 308, the method finishes this portion of the processing and goes back to 204 in FIG. 2.

Figure 4:
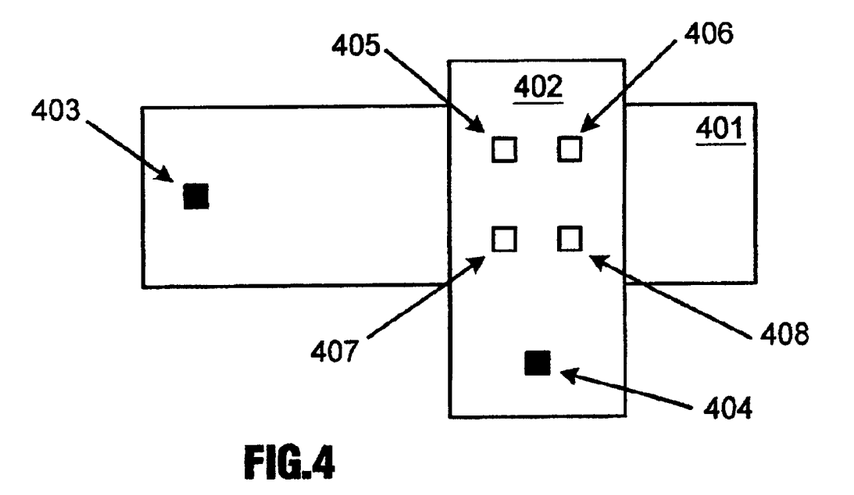
FIGS. 4~5 respectively illustrate, as an example, a top plan view of a first net in an integrated circuit layout and its graphical representation.
Figure 5:
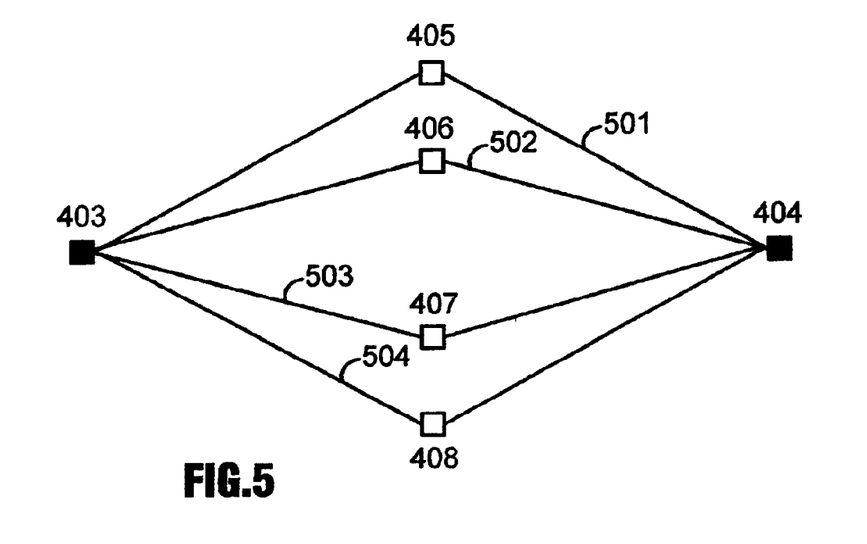

A couple of examples help to clarify the method. In FIG. 4, a net is formed extending from a contact 403 on a first metal strip 401 to a contact 404 on a second metal strip 402. Four redundant vias 404~407 couple the two metal strips 401 and 402 so that the contacts 403 and 404 are electrically connected. As shown in graphical representation in FIG. 5, the redundant vias 404~407 create four redundant paths 501~504 that couple contacts 403 and 404. After applying 301~303 of the method to this example, the resulting redundant path and net equations are determined to be:

$$RP(1) = LV_{403} * LV_{405} * LV_{404} \quad (2)$$

$$RP(2) = LV_{403} * LV_{406} * LV_{404} \quad (3)$$

$$RP(3) = LV_{403} * LV_{407} * LV_{404} \quad (4)$$

$$RP(4) = LV_{403} * LV_{408} * LV_{404} \quad (5)$$

$$EC = LV_{403} * LV_{404} * [LV_{405} + LV_{406} + LV_{407} + LV_{408}] \quad (6)$$

Applying 304–308 of the method to this first example, for "X"=1, it is clear that contacts 403 and 404 are critical vertices, in that if either of these vertices is significantly overlapped by a simulated defect, then the net fails. For "X"=2 and "X"=3, there are no identified sets of vertices, since there are no combinations of 2 or 3 redundant vertices that causes the net to fail (excluding combinations with critical vertices 403 and 404). For "X"=4, however, a combination of all four redundant vertices 405–408 is identified as a set of vertices that set the net equation "EC" to zero when they are each of logic value "0". Therefore, in this first example, the predefined sets of vertices are determined by the method described in reference to 301–308 of FIG. 2, to include the following three predefined sets of vertices:

$$S1 = \{LV_{403}\} \quad (7)$$

$$S2 = \{LV_{404}\} \quad (8)$$

$$S3 = \{LV_{405}, LV_{406}, LV_{407}, LV_{408}\} \quad (9)$$

Figure 6:
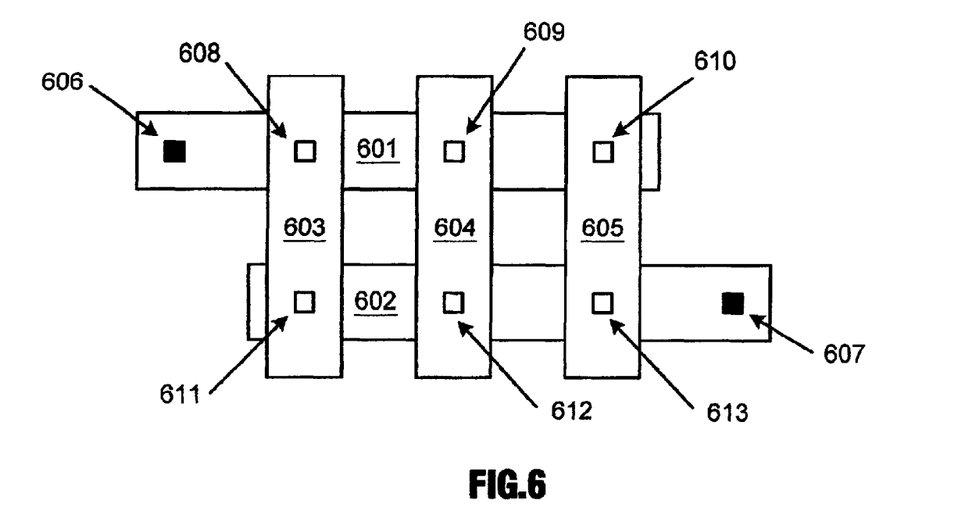
FIGS. 6~7 respectively illustrate, as another example, a top plan view of a second net in an integrated circuit layout and its graphical representation.

In FIG. 6, a net is formed extending from a contact 606 on a first metal strip 601 to a contact 607 on a second metal strip 602. In this second example, three metal straps 603–605 couple the two metal strips 601 and 602 through three corresponding pairs of vias so that the contacts 606 and 607 are electrically connected. As shown in the graphical representation in FIG. 7, each pair of vias creates a redundant path that couples contacts 606 and 607. In particular, a first pair of vias 608 and 611 are included in a first redundant path 701 coupling contacts 606 and 607 through the first metal strip 603, a second pair of vias 609 and 612 are included in a second redundant path 702 coupling contacts 606 and 607 through the second metal strip 604, and a third pair of vias 610 and 613 are included in a third redundant path 703 coupling contacts 606 and 607 through the third metal strip 605.

Figure 7:
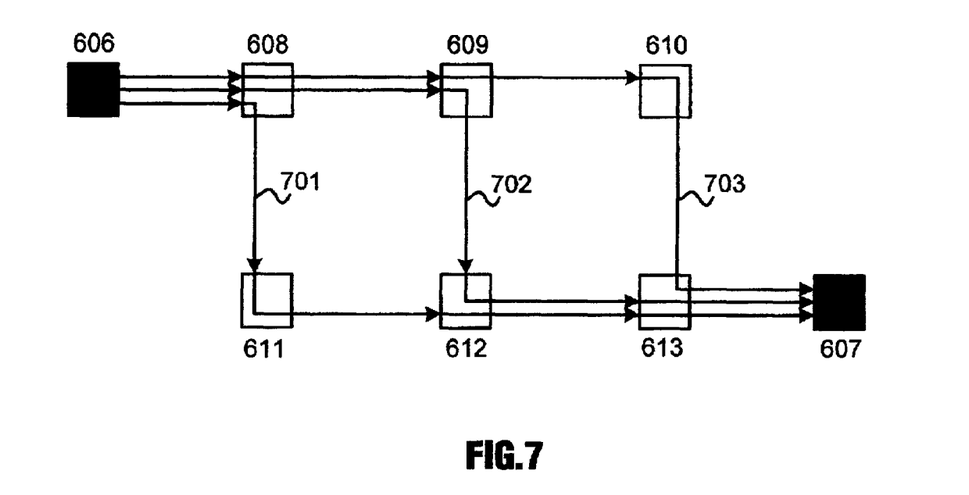

After applying 301–303 of the method to this second example, the resulting redundant path and net equations are determined to be:

$$RP(1) = LV_{606} * LV_{608} * LV_{611} * LV_{612} * LV_{613} * LV_{607} \quad (10)$$

$$RP(2) = LV_{606} * LV_{608} * LV_{609} * LV_{612} * LV_{613} * LV_{607} \quad (11)$$

$$RP(3) = LV_{606} * LV_{608} * LV_{609} * LV_{610} * LV_{613} * LV_{607} \quad (12)$$

$$EC = LV_{606} * LV_{608} * LV_{613} * LV_{607} * (LV_{611} * LV_{612} + LV_{609} * LV_{612} + LV_{609} * LV_{610}) \quad (13)$$

Applying 304–308 of the method to this second example, for "X"=1, it is clear that contacts 606 and 607 are critical vertices as well as vias 608 and 613, in that if any of these vertices is significantly overlapped by a simulated defect, then the net fails. Therefore, for this pass through 305–308 results in the following being identified as predefined sets of vertices:

$$S1 = \{LV_{606}\} \quad (14)$$

$$S2 = \{LV_{608}\} \quad (15)$$

$$S3 = \{LV_{613}\} \quad (16)$$

$$S4 = \{LV_{607}\} \quad (17)$$

Now looking at the remaining items within the parentheses in equation (13), for "X"=2, the following predefined sets of vertices are identified and added to the previous predefined sets of vertices:

$$S5 = \{LV_{611}, LV_{609}\} \quad (18)$$

$$S6 = \{LV_{612}, LV_{609}\} \quad (19)$$

$$S7 = \{LV_{612}, LV_{610}\} \quad (20)$$

For "X"=3 and on up to 8, there are no more identified sets of vertices, since there are no combinations of these numbers of vertices that cause the net to fail (excluding combinations with the previously identified sets S1–S7 described by equations (14)–(30)).

Although the various aspects of the present invention have been described with respect to a preferred embodiment, it will be understood that the invention is entitled to full protection within the full scope of the appended claims.

We claim:

1. A method for eliminating false failures saved by redundant paths during critical area analysis of an integrated circuit layout, comprising:

identifying vertices significantly encroached by one or more simulated defects; and eliminating false failures resulting from said one or more simulated defects if all nets including at least one of said identified vertices have at least one redundant path that does not include any of said identified vertices.

2. The method according to claim 1, wherein said eliminating false failures resulting from said one or more simulated defects if all nets including at least one of said identified vertices have at least one redundant path that does not include any of said identified vertices, comprises:

retrieving information of predefined sets of vertices associated with individual of said nets; and indicating a failure resulting from said one or more simulated defects for each instance where all elements of at least one of said predefined sets of vertices are one of said identified vertices.

3. The method according to claim 2, further comprising generating said predefined sets of vertices by:

extracting nets from information of an integrated circuit layout; and determining said predefined sets of vertices for individual of said nets such that said individual of said nets fails only if all elements of individual of said predefined sets of vertices are significantly encroached by one or more simulated defects.

4. The method according to claim 3, wherein individual of said predefined sets of vertices include redundant vertices as elements of said individual of said predefined sets of vertices.

5. The method according to claim 3, further comprising:

assigning to individual of said predefined sets of vertices, a group identifier unique to said individual of said predefined sets of vertices;

assigning to individual of said predefined sets of vertices, a group count equal to a total number of elements in said individual of said predefined sets of vertices; and associating individual elements of said predefined sets of vertices with group identifiers and group counts of associated ones of said predefined sets of vertices having said individual elements as an element.

6. The method according to claim 5, wherein said indicating a failure resulting from said one or more simulated defects for each instance where all elements of at least one of said predefined sets of vertices are one of said identified vertices, comprises indicating a failure resulting from said one or more simulated defects only if a number of said identified vertices having a same group identification equals a group count corresponding to said same group identification.

7. The method according to claim 3, wherein said determining said predefined sets of vertices for individual of said nets such that said individual of said nets fails only if all elements of individual of said predefined sets of vertices are significantly encroached by said one or more simulated defects, comprises:

defining a logic sum of redundant paths;

defining for individual of said redundant paths, a logic product of logic values of vertices included in said individual of said redundant paths; and determining said predefined sets of vertices for individual of said nets by identifying combinations of said vertices associated with said net that result in said logic sum of redundant paths equaling zero when logic values of said combinations of said vertices are zero.

8. The method according to claim 1, wherein said identified vertices include at least one via.

9. The method according to claim 8, wherein said identified vertices include at least one contact.

10. The method according to claim 1, wherein said identifying vertices significantly encroached by one or more simulated defects, comprises identifying vertices encroached by at least a preselected percentage by said one or more simulated defects.

11. The method according to claim 10, wherein said preselected percentage is selected such that an encroachment greater than said preselected percentage results in expected electrical failures of said identified vertices.

12. The method according to claim 11, wherein said expected electrical failures include excessive resistance levels.

13. The method according to claim 12, wherein said excessive resistance levels effectively result in open circuits.

14. The method according to claim 1, further comprising generating said one or more simulated defects using Monte Carlo simulation of defects on an integrated circuit physical layout.

15. The method according to claim 14, wherein said Monte Carlo simulation includes generating defects of probabilistic size and probabilistic location on layers of said integrated circuit physical layout.

16. A method for eliminating false failures saved by redundant paths during critical area analysis of an integrated circuit layout, comprising:

identifying vertices significantly encroached by one or more simulated defects;

retrieving predefined sets of vertices associated with individual of nets including at least one of said identified vertices; and indicating a failure resulting from said one or more simulated defects for each instance where all elements of at least one of said predefined sets of vertices are one of said identified vertices.

17. The method according to claim 16, further comprising generating said predefined sets of vertices by:

extracting nets from information of an integrated circuit layout; and determining said predefined sets of vertices for individual of said nets such that said individual of said nets fails only if all elements of individual of said predefined sets of vertices are significantly encroached by one or more simulated defects.

18. The method according to claim 17, further comprising:

assigning to individual of said predefined sets of vertices, a group identifier unique to said individual of said predefined sets of vertices;

assigning to individual of said predefined sets of vertices, a group count equal to a total number of elements in said individual of said predefined sets of vertices; and associating individual elements of said predefined sets of vertices with group identifiers and group counts of associated ones of said predefined sets of vertices having said individual elements as an element.

19. The method according to claim 18, wherein said indicating a failure resulting from said one or more simulated defects for each instance where all elements of at least one of said predefined sets of vertices are one of said identified vertices, comprises indicating a failure resulting from said one or more simulated defects only if a number of said identified vertices having a same group identification equals a group count corresponding to said same group identification.

20. The method according to claim 17, wherein said determining said predefined sets of vertices for individual of said nets such that said individual of said nets fails only if all elements of individual of said predefined sets of vertices are significantly encroached by said one or more simulated defects, comprises:

defining a logic sum of redundant paths;

defining for individual of said redundant paths, a logic product of logic values of vertices included in said individual of said redundant paths; and determining said predefined sets of vertices for individual of said nets by identifying combinations of said vertices associated with said net that result in said logic sum of redundant paths equaling zero when logic values of said combinations of said vertices are zero.

\* \* \* \* \*